(12) United States Patent
Wang et al.

(10) Patent No.: US 11,018,103 B2
(45) Date of Patent: May 25, 2021

(54) INTEGRATED CIRCUIT STRUCTURE

(71) Applicant: NANYA TECHNOLOGY CORPORATION, New Taipei (TW)

(72) Inventors: Chien-Chung Wang, New Taipei (TW); Hsih-Yang Chiu, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 29 days.

(21) Appl. No.: 16/576,757

(22) Filed: Sep. 19, 2019

(65) Prior Publication Data
US 2021/0091020 A1    Mar. 25, 2021

(51) Int. Cl.
*H01L 23/00* (2006.01)

(52) U.S. Cl.
CPC .............. *H01L 24/05* (2013.01); *H01L 24/13* (2013.01); *H01L 2224/02206* (2013.01); *H01L 2224/0401* (2013.01); *H01L 2224/10126* (2013.01); *H01L 2224/13147* (2013.01); *H01L 2224/13582* (2013.01); *H01L 2224/13655* (2013.01); *H01L 2924/014* (2013.01)

(58) Field of Classification Search
CPC ..... H01L 24/05; H01L 24/13; H01L 23/3192; H01L 22/20; H01L 24/11; H01L 25/0657; H01L 24/12; H01L 24/06; H01L 24/49; H01L 22/30; H01L 22/32; H01L 22/14; H01L 24/48; H01L 24/94; H01L 23/3114; H01L 23/525; H01L 23/49816; H01L 21/76888; G01R 31/26; H05K 999/99
USPC ......... 257/737, 48, 738, 774, 762, 773, 750, 257/778, E21.589, E23.01; 438/613, 15, 438/615, 652, 108
See application file for complete search history.

(56) References Cited

U.S. PATENT DOCUMENTS

| | | | | |
|---|---|---|---|---|
| 2002/0117759 | A1* | 8/2002 | Bauch | H01L 23/528 257/763 |
| 2007/0164279 | A1* | 7/2007 | Lin | H01L 24/05 257/48 |
| 2009/0243118 | A1* | 10/2009 | Akiba | H01L 24/03 257/773 |
| 2010/0301459 | A1* | 12/2010 | Akiba | H01L 24/11 257/620 |
| 2013/0026629 | A1* | 1/2013 | Nakano | H01L 23/3192 257/737 |
| 2014/0014959 | A1* | 1/2014 | Jeng | H01L 21/76885 257/48 |
| 2014/0203438 | A1* | 7/2014 | Chen | H01L 23/3114 257/761 |
| 2015/0348922 | A1* | 12/2015 | Chen | H01L 24/11 438/613 |

* cited by examiner

*Primary Examiner* — Mouloucoulaye Inoussa
(74) *Attorney, Agent, or Firm* — CKC & Partners Co., LLC

(57) ABSTRACT

An integrated circuit structure includes a substrate, a metal pad, a first passivation layer, a second passivation layer, and a conductive bump. The metal pad is over the substrate. The metal pad includes a probing portion and a bumping portion laterally connected to the probing region. The first passivation layer is over the metal pad. The second passivation layer is over the first passivation layer and has an opening. The bumping portion is in the opening. The conductive bump is in the opening of the second passivation layer and contacts the probing portion. The probing portion and the conductive bump are separated by the first passivation layer.

11 Claims, 9 Drawing Sheets

INTEGRATED CIRCUIT STRUCTURE

BACKGROUND

Field of Invention

The present invention relates to an integrated circuit structure.

Description of Related Art

Flip chip technology allows the largest numbers of inputs/outputs ("I/Os") for the smallest footprint of the chip. In the fabrication process for solder ball flip chip assembly of an integrated circuit chip, after completing the multilevel interconnect structure, bonding pads are formed on the top surface of the interconnect structure to provide external electrical connections to the chip. A wafer probing test is practiced on the bonding pads to assess the electrical characteristics of the chip. An insulator layer may extend to cover the probed bonding pad. The proved bonding pad may have holes created by the wafer probing test, and thus the overlying insulator layer is not strong enough to support the solder ball.

SUMMARY

The embodiments of the present disclosure provide an integrated circuit structure. The integrated circuit structure includes a substrate, a metal pad, a first passivation layer, a second passivation layer, and a conductive bump. The metal pad is over the substrate. The metal pad includes a probing portion and a bumping portion laterally connected to the probing region. The first passivation layer is over the metal pad. The second passivation layer is over the first passivation layer and has an opening. The bumping portion is in the opening. The conductive bump is in the opening of the second passivation layer and contacts the probing portion. The probing portion and the conductive bump are separated by the first passivation layer.

In some embodiments, the first passivation layer is between the second passivation layer and the metal pad.

In some embodiments, the probing portion and the conductive bump are separated by the second passivation layer.

In some embodiments, the second passivation layer has a material different from a material of the first passivation layer.

In some embodiments, the probing portion has a hole extending from a top surface of the probing portion.

In some embodiments, an orthogonal projection of the conductive bump on the metal pad is spaced from the probing portion of the metal pad.

In some embodiments, the first passivation layer has an opening, and the second passivation layer is in the opening of the first passivation layer and contacts the probing portion of the metal pad.

In some embodiments, the probing portion of the metal pad is free from coverage by the conductive bump.

In some embodiments, the first passivation layer includes silicon oxide and silicon nitride, and the second passivation layer includes polyimide.

In some embodiments, a width of the probing portion is substantially the same as a width of the bumping portion.

In some embodiments, the metal pad has a dumbbell top view shape.

In some embodiments, the metal pad further comprises a connecting portion between and adjoining the probing portion and the bumping portion.

In some embodiments, the connecting portion has a width less than a width of the probing portion.

In some embodiments, the connecting portion has a width less than a width of the bumping portion.

In some embodiments, the probing portion, the bumping portion, and the connecting portion collectively have a dumbbell top view shape.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiment, with reference made to the accompanying drawings as follows.

DETAILED DESCRIPTION

Figure 1:
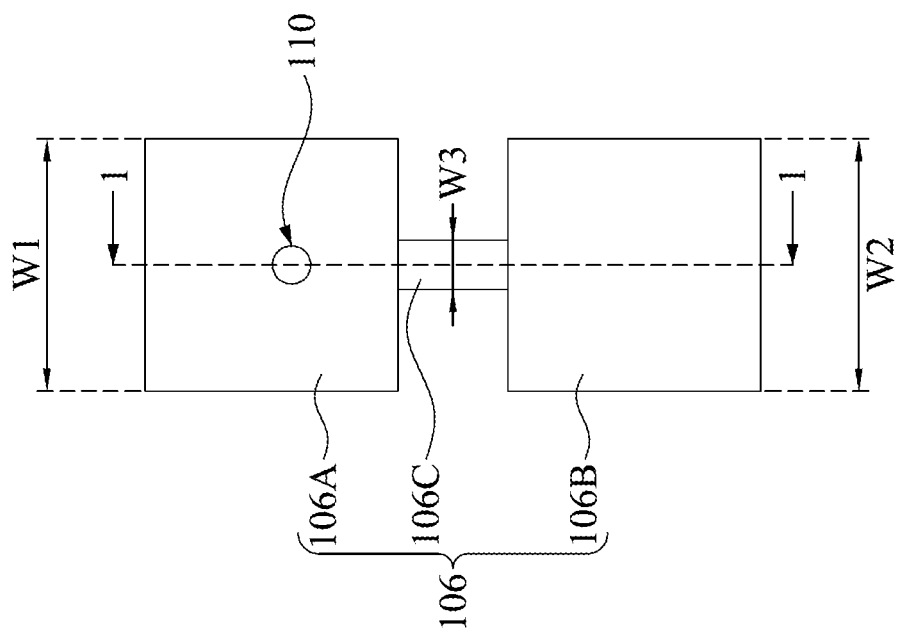
FIG. 1 is a top view of a metal pad in accordance with various embodiments of the present disclosure.

Reference will now be made in detail to the present embodiments of the invention, examples of which are illustrated in the accompanying drawings. Wherever possible, the same reference numbers are used in the drawings and the description to refer to the same or like parts.

Figure 2:
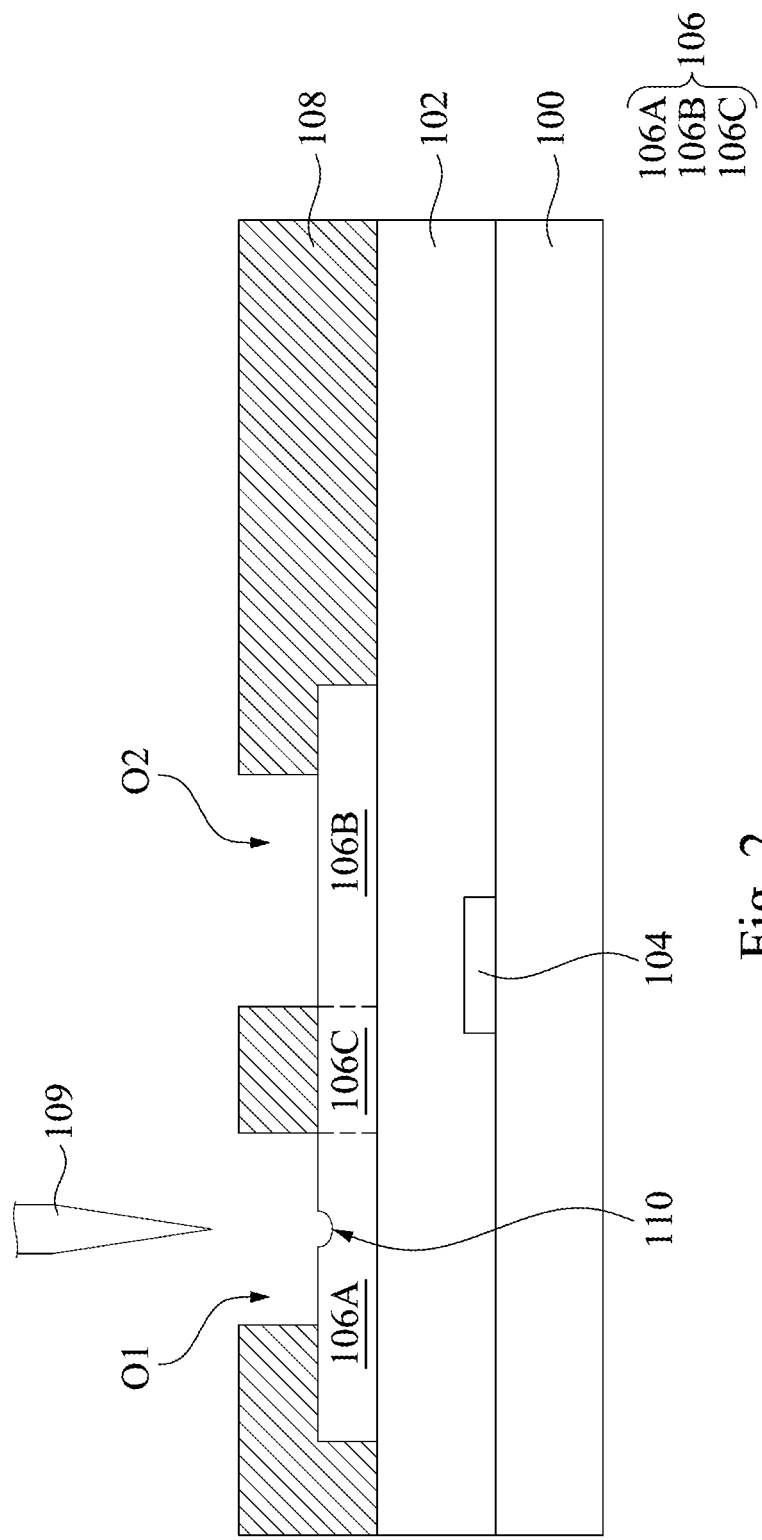
FIGS. 2-9 are cross-sectional views of a manufacturing method of an integrated circuit structure including the metal pad of FIG. 1 at various stages, in which the cross-sectional views are taken along line 1-1 of FIG. 1.

FIG. 1 is a top view of a metal pad 106 in accordance with various embodiments of the present disclosure. FIGS. 2-9 are cross-sectional views of a manufacturing method of an integrated circuit structure 10 including the metal pad 106 of FIG. 1 at various stages, in which the cross-sectional views are taken along line 1-1 of FIG. 1. Reference is made to FIGS. 1 and 2. An interconnection structure 102 is formed on a substrate 100. The substrate 100 may be a semiconductor substrate, such as a bulk silicon substrate, although it may include other semiconductor materials, such as group III, group IV, and/or group V elements. A semiconductor device 104, such as a transistor, may be formed at a surface of the substrate 100. The interconnection structure 102, which includes metal lines and vias (not shown) formed therein, is connected to the semiconductor device 104. The metal lines and the vias may be formed of copper or copper alloys, and may be formed using damascene processes. The interconnection structure 102 may include inter-layer dielectrics (ILDs) and inter-metal dielectrics (IMDs).

A metal pad 106 is formed over the substrate 100. As shown in FIG. 21, the metal pad 106 is formed on the interconnection structure 102. A first passivation layer 108 is formed over the metal pad 106. The metal pad 106 may include aluminum, copper, silver, gold, nickel, tungsten, alloys thereof, and/or multi-layers thereof. The metal pad 106 may be electrically connected to the semiconductor devices 104, for example, through the underlying interconnection structure 102. In some embodiments, the metal pad 106 includes a probing portion 106A and a bumping portion 106B laterally connected to the probing portion 106A. The bumping portion 106B provides an electrical connection upon which a bump structure, such as an under-bump metallization (UBM) layer (e.g., the UBM layer 114 shown in FIG. 4) or a copper pillar bump (e.g., the conductive bump 118 shown in FIG. 6), configured to facilitate external electrical connections.

FIG. 2 also illustrates a probing step, which may be used in a wafer-acceptance-test or a circuit test. The probing step is performed to verify the functionality of the semiconductor devices 104 and the interconnection structure 102. The proving step may be performed by physically contacting a probe needle 109 to the metal pad 106. The probe needle 109 may be a part of a probe card. For example, the probe card is connected to a test equipment (not shown). During probing and testing of the integrated circuit structure 10, an electrical signal is transmitted from the interconnection structure 102 through the metal pad 106.

The probing portion 106A and the bumping portion 106B of the metal pad 106 are designed to be large enough for the probing step and a subsequent bumping process. In some embodiments, a width W1 of the probing portion 106A is substantially the same as a width W2 of the bumping portion 106B of the metal pad 106. Therefore, an improved process flexibility can be realized by exchanging positions between the probing portion 106A and the bumping portion 106B. In some embodiments, the metal pad 106 has a dumbbell top view shape. In greater detail, the metal pad 106 further includes a connecting portion 106C between and adjoining the probing portion 106A and the bumping portion 106B. The connecting portion 106C has a width W3 less than the width W1 of the probing portion 106A in some embodiments. In some embodiments, the connecting portion 106C has a width W3 less than the width W2 of the bumping portion 106B as well. The probing portion 106A, the bumping portion 106B, and the connecting portion 106C collectively have a dumbbell top view shape. Therefore, the first passivation layer 108 may have a thickness measured from the top surface of the metal pad 106 large enough to provide sufficient support for a subsequently formed second passivation layer 112 (see FIG. 3). The connecting portion 106C, the bumping portion 1066, and the probing portion 106A are one-piece integrally-formed and thus collectively provide a smooth and uniform surface for the probing step and the bumping step. In other words, there is no interface in the metal pad 106, which is a continuous element. The metal pad 106 with such configuration can provide compatibility with existing process of pad formation.

In some embodiment, the first passivation layer 108 is formed of material such as silicon oxide, silicon nitride, and/or multi-layers thereof. Some portions of the first passivation layer 108 may cover the edge portions of the metal pad 106, and a top surface of the probing portion 106A and a top surface of the bumping portion 1066 of the metal pad 106 are exposed through an opening O1 and an opening O2 in the first passivation layer 108, respectively. The first passivation layer 108 extends along a top surface of the connecting portion 106C. In greater detail, the connecting portion 106C is within an orthogonal projection of the first passivation layer 108 on the metal pad 106. During probing and testing of the integrated circuit structure 10, an electrical signal is transmitted from the interconnection structure 102 through the probing portion 106A of the metal pad 106. The probing step is performed on the exposed surface of the probing portion 106A. The probe needle 109 may dent or mark the metal pad 106. In some embodiment, such denting or marking on the metal can lead to the formation of a hole 110 extending from a top surface of the probing portion 106A, as shown in FIG. 2.

Figure 3:
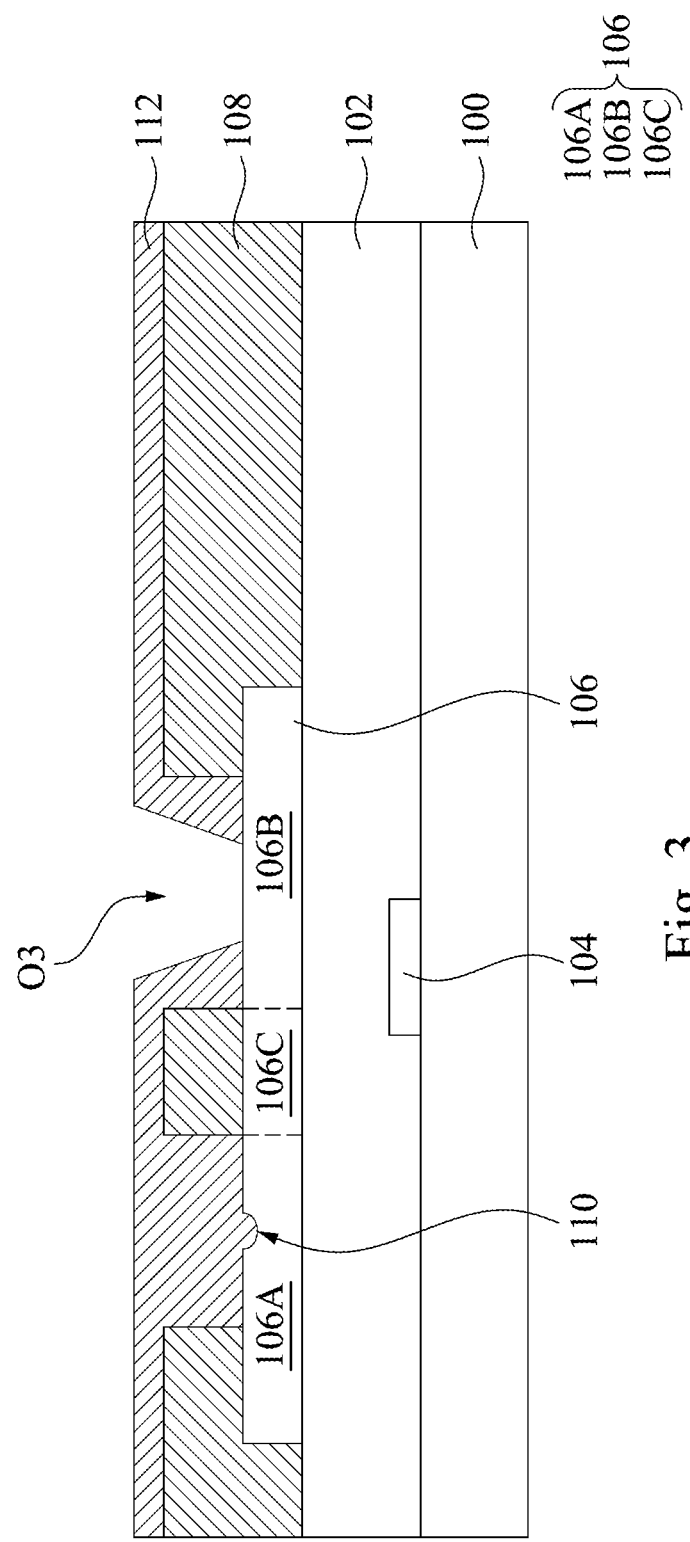

Reference is made to FIG. 3. A second passivation layer 112 is formed over the first passivation layer 108 and the metal pad 106.

A topography of the second passivation layer 112 has an effect on a surface profile uniformity of a subsequently formed conductive bump 118 (see FIG. 6). Since the first passivation layer 108 provides good support during the formation of the second passivation layer 112, the second passivation layer 112 has a balanced topography. Therefore, the second passivation layer 112 can prevent the conductive bump 118 from collapsing or slanting and results in increasing the surface profile uniformity of the subsequently formed conductive bump 118. In this way, the conductive bump 118 may have a substantially symmetric profile. This allows for fabrication of finer bump pitches and fine redistribution wiring for high interconnect densities. The second passivation layer 112 fills in the opening O1 of the first passivation layer 108 and contacts the probing portion 106A of the metal pad 106. In some embodiments, the second passivation layer 112 fills the hole 110 as well.

An opening O3 is formed through the second passivation layer 112 such that the top surface of the bumping portion 106B is exposed. In other words, the bumping portion 106B is in the opening O3. The second passivation layer 112 remains on and lines opposite sidewalls of the opening O3. In some embodiments, the second passivation layer 112 has a material different from a material of the first passivation layer 108. For example, the second passivation layer 112 may include a polymer such as polyimide (PI).

Figure 4:
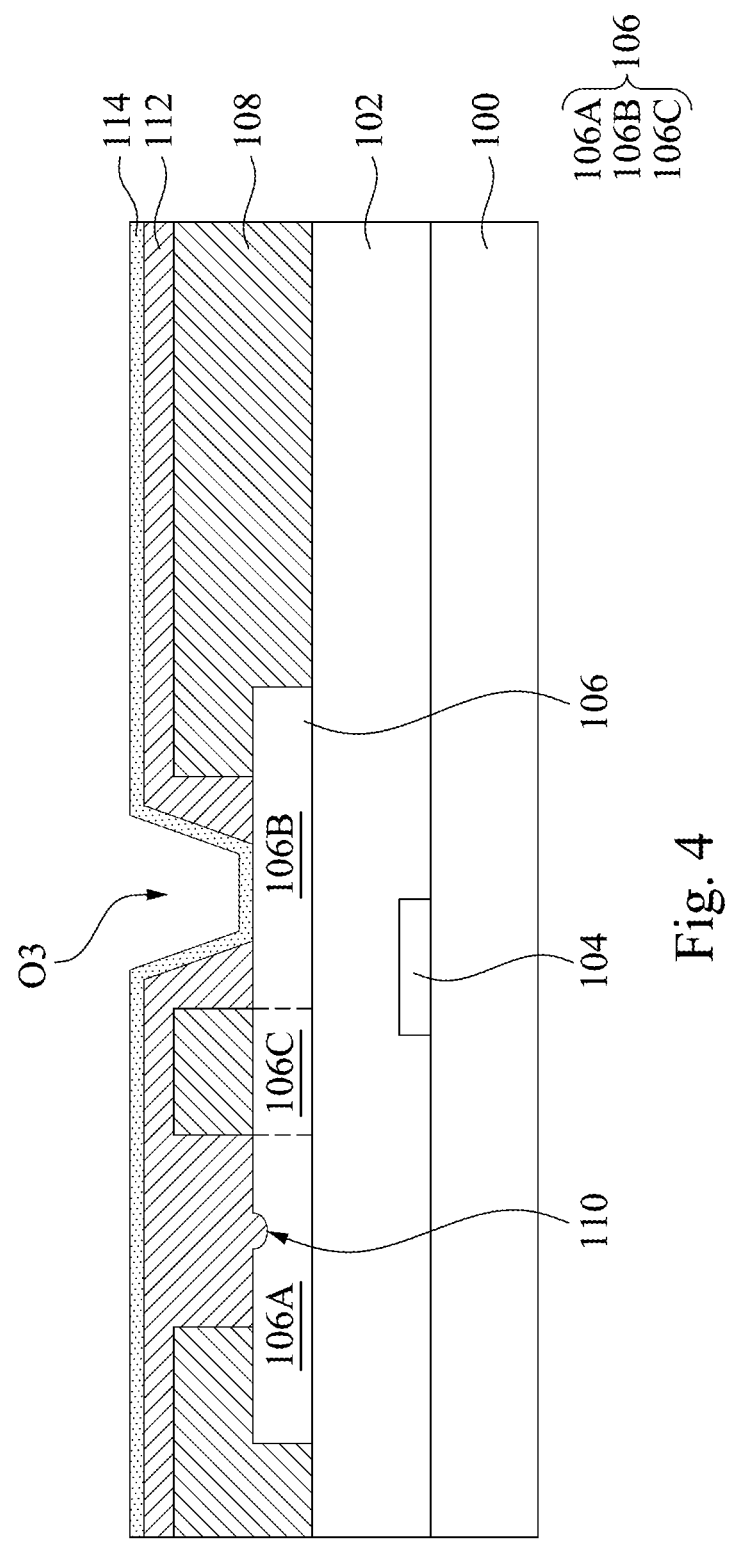

Reference is then made to FIG. 4. An under-bump metallization (UBM) layer 114 is formed over surfaces of the second passivation layer 112 and the exposed surface of the bumping portion 106B of the metal pad 106. In some embodiments, the UBM layer 114 includes a diffusion barrier layer or a glue layer, which may include titanium (Ti), tantalum (Ta), titanium nitride (TiN), tantalum nitride (TaN), or the like and be formed by physical vapor deposition (PVD) or sputtering. The UBM layer 114 may further include a seed layer formed on the diffusion barrier layer by PVD or sputtering. The seed layer may be formed of copper (Cu) or copper alloys including Al, chromium (Cr), nickel (Ni), tin (Sn), gold (Ag), or combinations thereof. In some embodiments, the UBM layer 114 includes a Ti layer and a Cu seed layer. The UBM layer 114 is in contact with and lines sidewalls of the second passivation layer 112.

Figure 5:
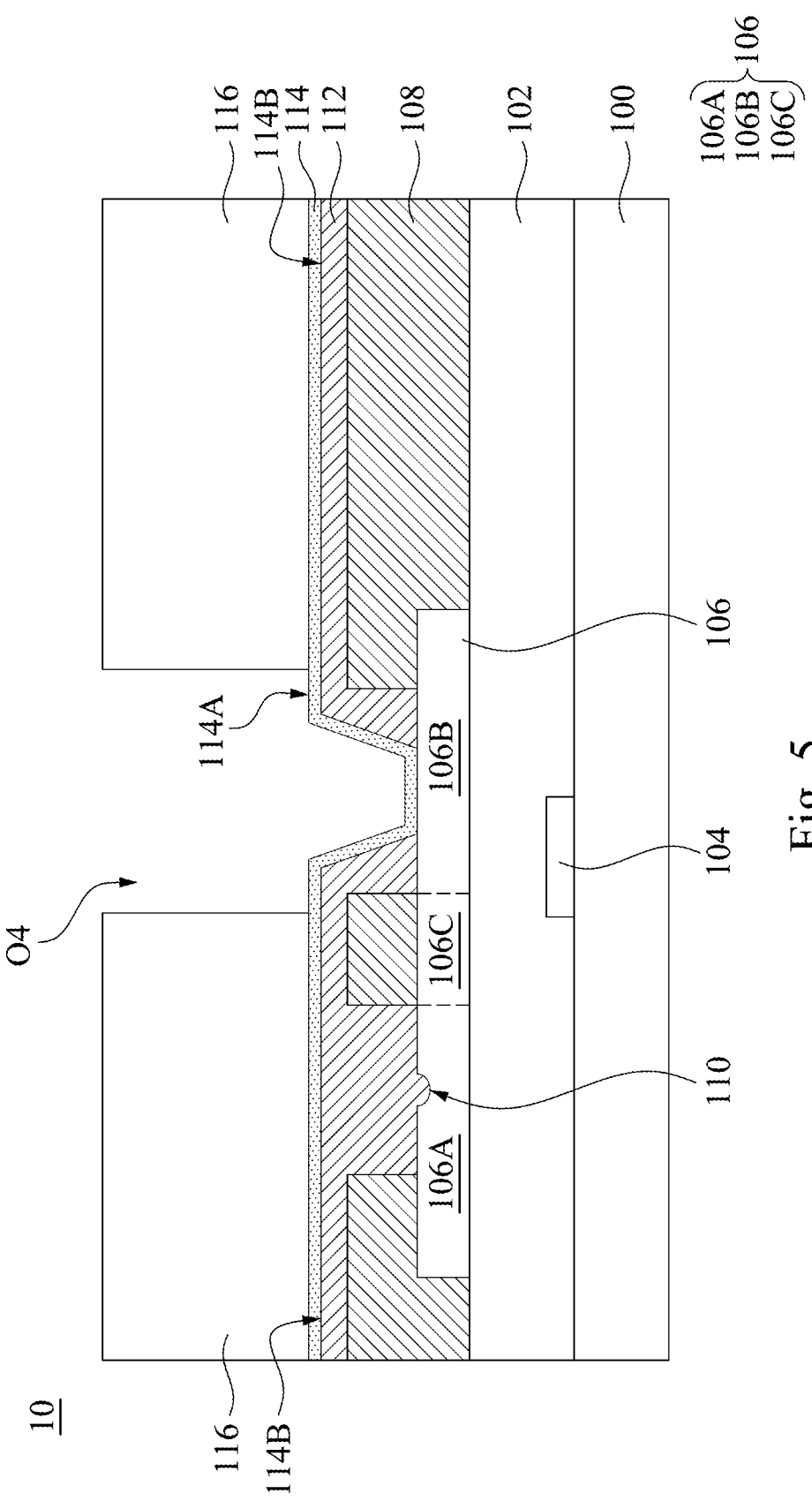

FIG. 5 illustrates the formation of a mask 116, which may be formed of a photo resist or a dry film, for example. The mask 116 is patterned, and a first portion 114A of the UBM layer 114 is exposed through an opening O4 in the mask 116, while a second portion 114B of the UBM layer 114 is covered by the mask 116.

Figure 6:
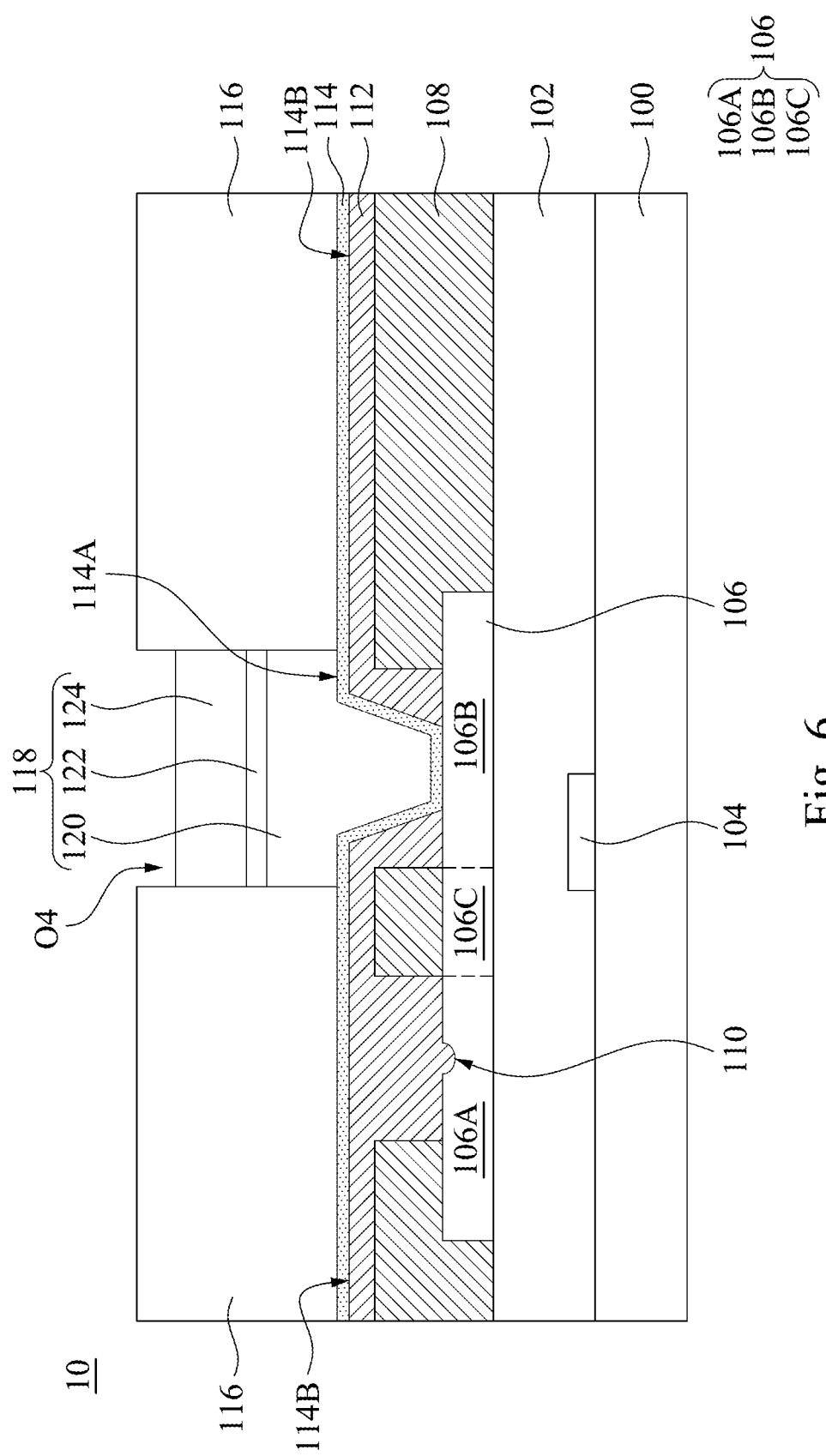
Figure 7:
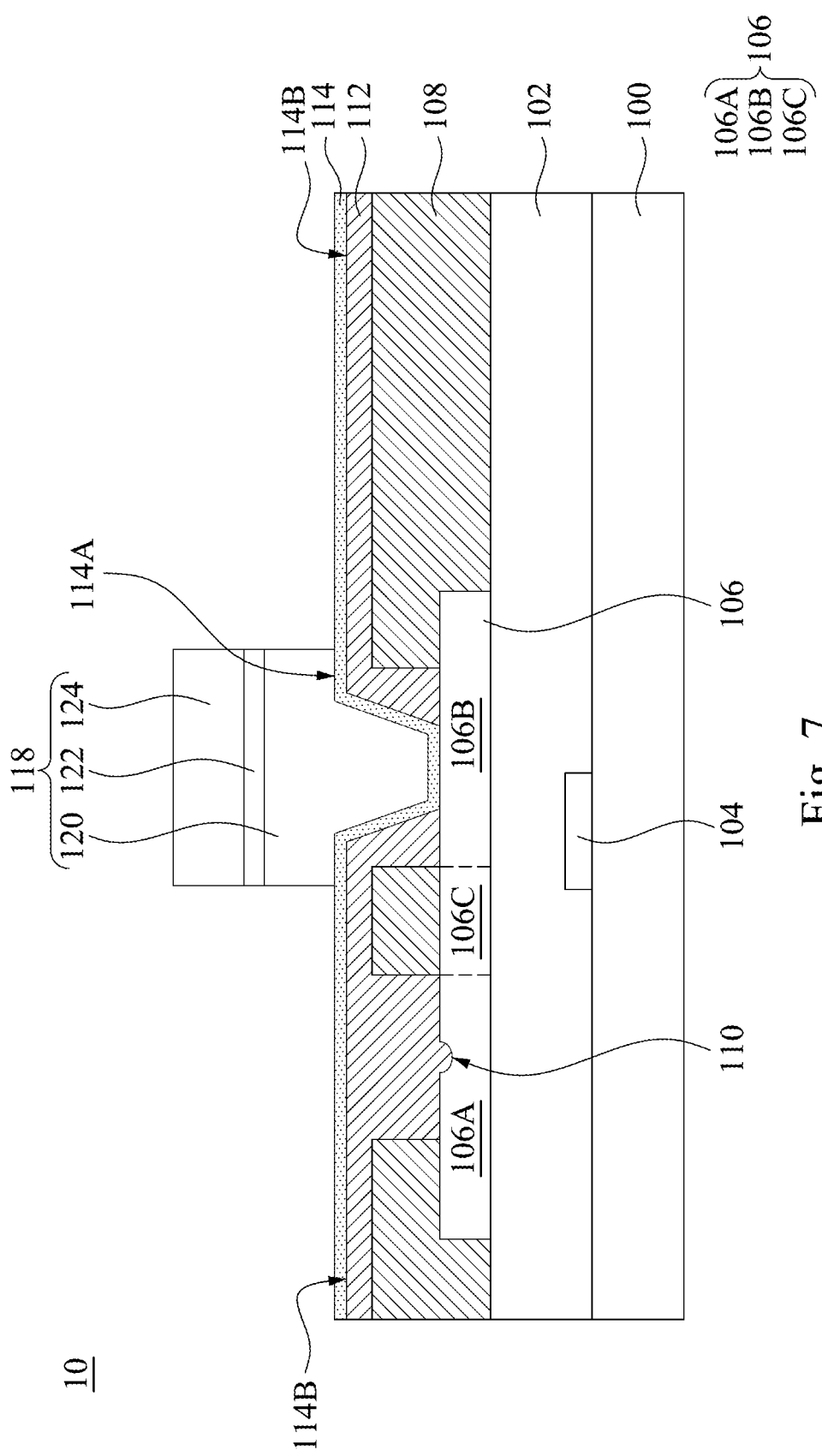

Next, as shown in FIG. 6, a conductive bump 118 is formed on the UBM layer 114 and in the opening O4 of the mask 116. As illustrated, the conductive bump 118 is in the opening O3 of the second passivation layer 112 and contacts the bumping portion 106B through the UBM layer 114. The probing portion 106A and the conductive bump 118 are separated by the first passivation layer 108. The probing portion 106A of the metal pad 106 is free from coverage by the conductive bump 118. In greater detail, an orthogonal projection of the conductive bump 118 on the metal pad 106 is spaced from the probing portion 106A of the metal pad 106. The first passivation layer 108 is between the second passivation layer 112 and the metal pad 106. The probing portion 106A and the conductive bump 118 are separated by the second passivation layer 112. Therefore, top portions of the second passivation layer 112 can be at the same horizontal level.

In some embodiments, the integrated circuit structure 10 is placed into an electroplating solution (not shown), and an electroplating step is performed to form the conductive bump 118 on the UBM layer 114 and in opening O4. Since the probing step is performed prior to the formations of the second passivation layer 112 and of the conductive bump 118, the metal shavings dislodged from the probing portion 106A of the metal pad 106 during the probing step, which may be disadvantageously influence the electroplating step of forming the conductive bump 118, can be prevented from entering the bumping portion 106B of the metal pad 106.

In some embodiments, a copper (Cu) pillar 120 is formed in the opening O4 to contact the underlying UBM layer 114. The Cu pillar 120 is intended to include substantially a layer including pure elemental copper, copper containing unavoidable impurities, and/or copper alloys containing minor amounts of elements such as tantalum, indium, tin, zinc, manganese, chromium, titanium, germanium, strontium, platinum, magnesium, aluminum or zirconium. Next, a metal cap layer 122 is formed on a top surface of the Cu pillar 120. The metal cap layer 122 could act as a barrier layer to prevent copper in the Cu pillar 120 to diffuse into bonding material, such as solder alloy, that is used to bond the substrate 100 to external features. The prevention of copper diffusion increases the reliability and bonding strength of the package. The metal cap layer 122 is a nickel layer or a nickel alloy layer. A solder layer 124 is then formed on the metal cap layer 122 within the opening O4 of the mask 116. The solder layer 124 may be a lead-free layer formed of, for example, Sn, Ag, or a solder material, including alloys of tin, lead, silver, copper, nickel, bismuth, or combinations thereof.

Figure 8:
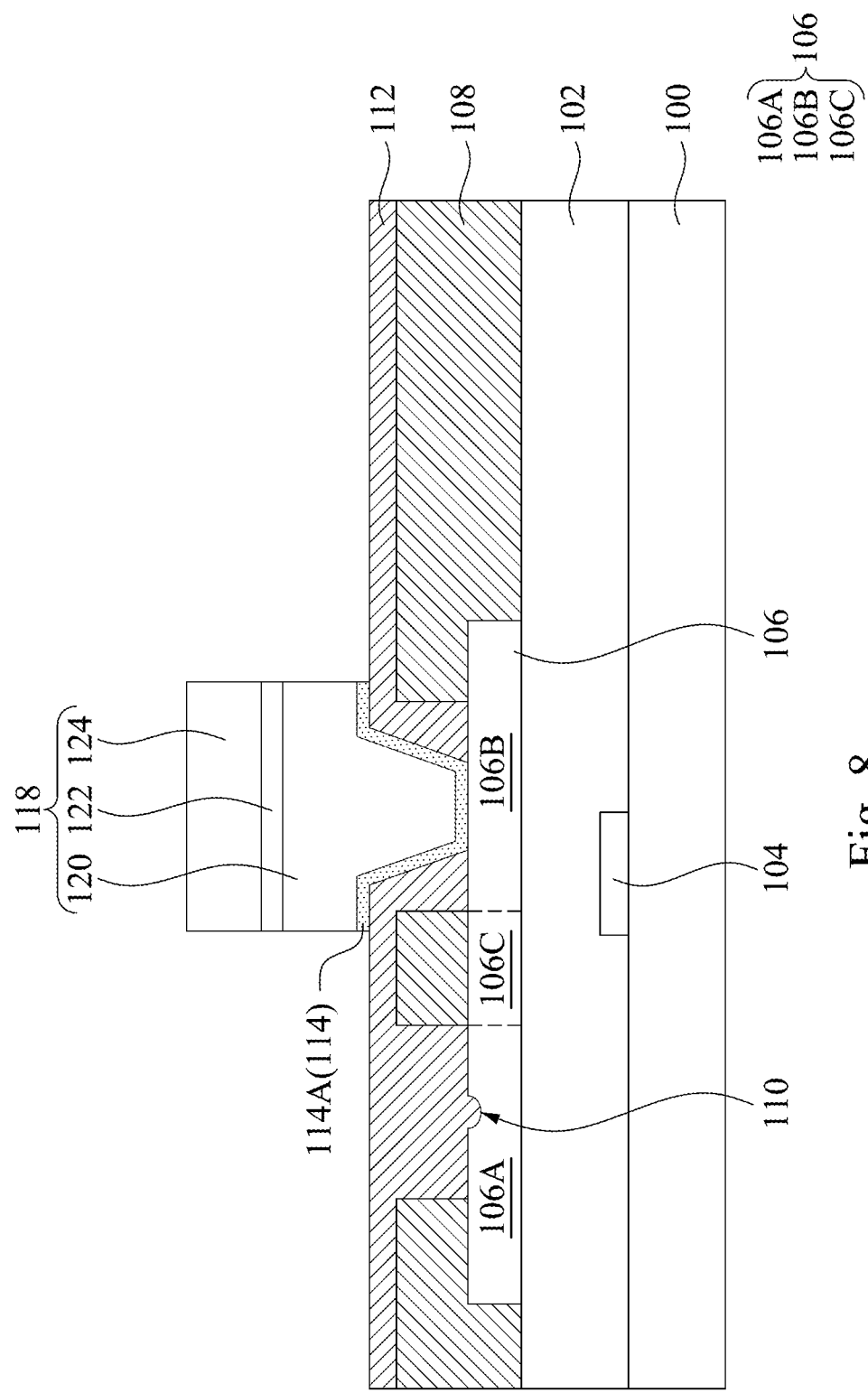
Figure 9:
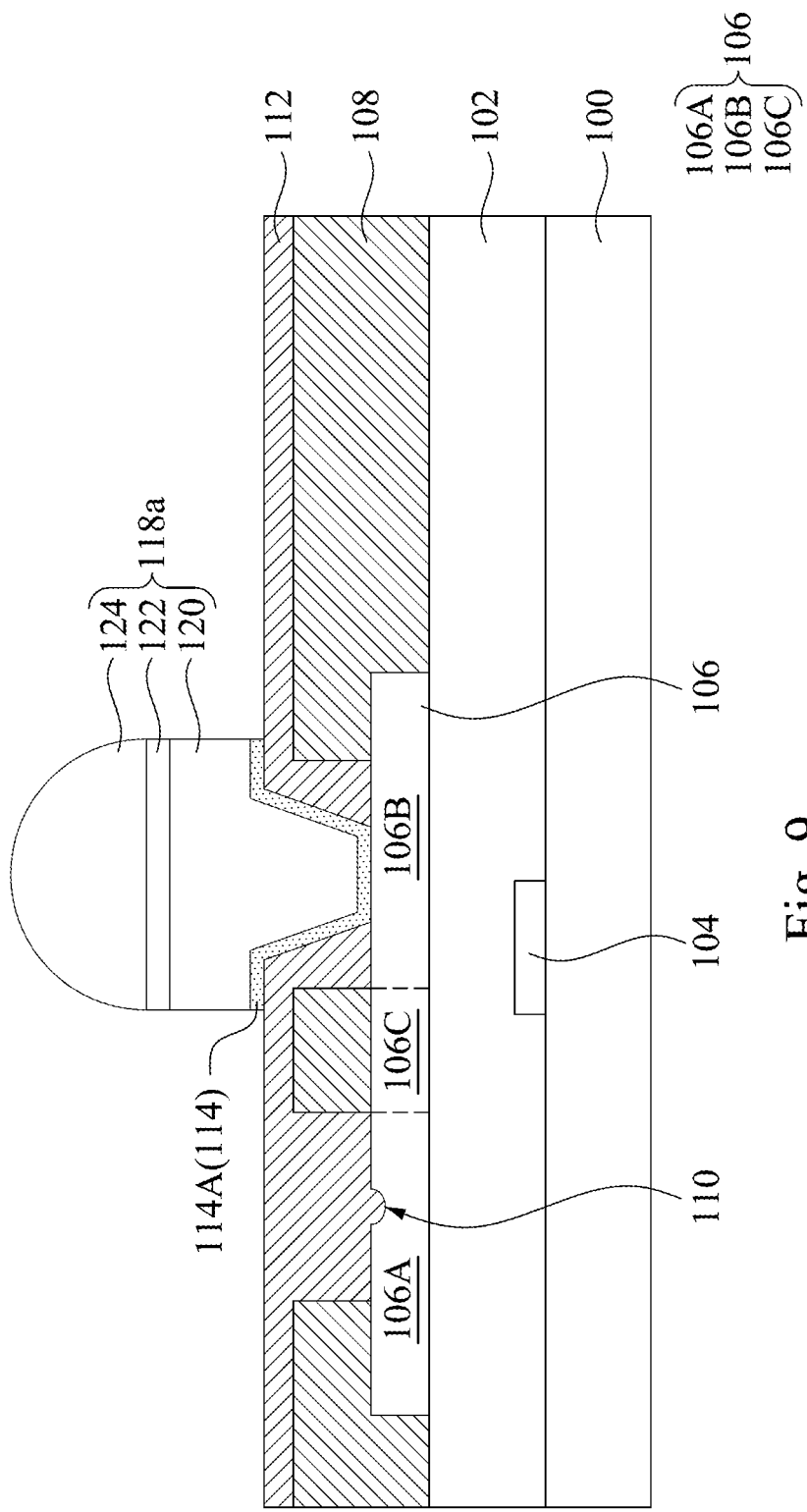

Referring to FIG. 67, after the formation of the conductive bump 118, the mask 116 is removed. As a result, the second portion 114B of the UBM layer 114 underlying the mask 116 is exposed. Next, the second portion 114B of the UBM layer 114 is removed, as shown in FIG. 8. The second portion 114B of the UBM layer 114 is etched by a reactive ion beam (RIE) process using the conductive bump 118 as an etching mask to protect the underlying first portion 114A of the UBM layer 114. A reflowing process is then performed to the of solder layer 124 of the conductive bump 118 such that a conductive bump 118a of FIG. 9 is formed. The integrated circuit structure 10 is then flipped upside down and attached to another substrate (not shown) such as a printed circuit board (PCB) or other suitable substrate.

By using the embodiments, the first passivation layer provides good support for the second passivation layer, and therefore the second passivation layer has a balanced topography. As a result, the second passivation layer can prevent the conductive bump from collapsing or slanting and results in increasing the surface profile uniformity of the subsequently formed conductive bump. In this way, the conductive bump may have a substantially symmetric profile. This allows for fabrication of finer bump pitches and fine redistribution wiring for high interconnect densities.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. An integrated circuit structure, comprising:
a substrate;
a metal pad over the substrate, wherein the metal pad comprises a probing portion, a bumping portion laterally connected to the probing portion, and a connecting portion between and adjoining the probing portion and the bumping portion;
a first passivation layer over the metal pad;
a second passivation layer over the first passivation layer and having an opening, wherein the bumping portion is in the opening; and
a conductive bump in the opening of the second passivation layer and contacting the probing portion, wherein the probing portion and the conductive bump are separated by the first passivation layer,
the probing portion, the connecting portion, and the bumping portion are arranged along a first direction, a width of the probing portion extending along a second direction perpendicular to the first direction is greater than a width of the connecting portion extending along the second direction and same as a width of the bumping portion extending along the second direction.

2. The integrated circuit structure of claim 1, wherein the first passivation layer is between the second passivation layer and the metal pad.

3. The integrated circuit structure of claim 2, wherein the probing portion and the conductive bump are separated by the second passivation layer.

4. The integrated circuit structure of claim 2, wherein the second passivation layer has a material different from a material of the first passivation layer.

5. The integrated circuit structure of claim 1, wherein the probing portion has a hole extending from a top surface of the probing portion.

6. The integrated circuit structure of claim 1, wherein an orthogonal projection of the conductive bump on the metal pad is spaced from the probing portion of the metal pad.

7. The integrated circuit structure of claim 1, wherein the first passivation layer has an opening, and the second passivation layer is in the opening of the first passivation layer and contacts the probing portion of the metal pad.

8. The integrated circuit structure of claim 1, wherein the probing portion of the metal pad is free from coverage by the conductive bump.

9. The integrated circuit structure of claim 1, wherein the first passivation layer includes silicon oxide and silicon nitride, and the second passivation layer includes polyimide.

10. The integrated circuit structure of claim 1, wherein the metal pad has a dumbbell top view shape.

11. The integrated circuit structure of claim 1, wherein the probing portion, the bumping portion, and the connecting portion collectively have a dumbbell top view shape.

* * * * *